(12) United States Patent
Van Den Enden et al.

(10) Patent No.: US 7,336,208 B2
(45) Date of Patent: Feb. 26, 2008

(54) UP AND DOWN SAMPLE RATE CONVERTER

(75) Inventors: Adrianus Wilhelmus Maria Van Den Enden, Waalre (NL); Marc Victor Arends, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 10/550,875

(22) PCT Filed: Mar. 24, 2004

(86) PCT No.: PCT/IB2004/050323

§ 371 (c)(1),
(2), (4) Date: Sep. 27, 2005

(87) PCT Pub. No.: WO2004/088841

PCT Pub. Date: Oct. 14, 2004

(65) Prior Publication Data

US 2006/0273938 A1 Dec. 7, 2006

(30) Foreign Application Priority Data

Mar. 31, 2003 (EP) .................................. 03100846

(51) Int. Cl.
*H03M 7/00* (2006.01)
(52) U.S. Cl. ...................................................... 341/61
(58) Field of Classification Search ................. 341/61, 341/144, 155, 143; 370/914; 375/327
See application file for complete search history.

(56) References Cited

U.S. PATENT DOCUMENTS

| | | | |
|---|---|---|---|
| 4,691,233 A * | 9/1987 | Acampora .............. 375/240.05 |
| 5,157,395 A | 10/1992 | Del Signore et al. |
| 5,355,328 A * | 10/1994 | Arbeiter et al. .............. 708/313 |
| 5,485,152 A | 1/1996 | Sobol et al. |
| 5,602,762 A * | 2/1997 | Lyon .......................... 702/190 |
| 5,666,299 A * | 9/1997 | Adams et al. .............. 708/200 |
| 5,928,152 A * | 7/1999 | Wright et al. ............... 600/447 |
| 5,963,160 A * | 10/1999 | Wilson et al. .............. 341/143 |
| 6,029,116 A * | 2/2000 | Wright et al. ................ 702/32 |
| 6,137,349 A * | 10/2000 | Menkhoff et al. .......... 327/552 |
| 6,208,671 B1 | 3/2001 | Paulos et al. |
| 6,295,325 B1 * | 9/2001 | Farrow et al. .............. 375/327 |
| 6,310,566 B1 * | 10/2001 | McNeely .................... 341/123 |

(Continued)

FOREIGN PATENT DOCUMENTS

WO    WO 00/65713    11/2000

*Primary Examiner*—Peguy JeanPierre

(57) ABSTRACT

Sample rate converters (12) for converting input sample rates ($F_{s1}$) of signals into output sample rates ($F_{s4}$) are provided with sample rate adapters (3,6) for adapting (basic idea) intermediate sample rates ($F_s2$) such that output sample rates ($F_s4$) are larger (upsampling) or smaller (downsampling) than input sample rates ($F_{s1}$), to reduce their complexity and to avoid bookkeeping and structure switching problems. Sample rate adapters (3,6) in the form of variable sample rate decreasers (3) allow the sample rate converters (12) to be used in video applications requiring DC-out being equal to DC-in. Sample rate adapters (3,6) in the form of variable sample rate increasers (6) allow the sample rate converters (12) to be used in audio applications. By locating the sample rate adapter (3,6) between a fixed sample rate increaser (1) for increasing with a factor K and a fixed sample rate decreaser (5) for decreasing with a factor M, filters (2,4) in between can be designed independently from the varying factor L as long as K and M are fixed and $^L<$-K.

7 Claims, 2 Drawing Sheets

Figure 1:
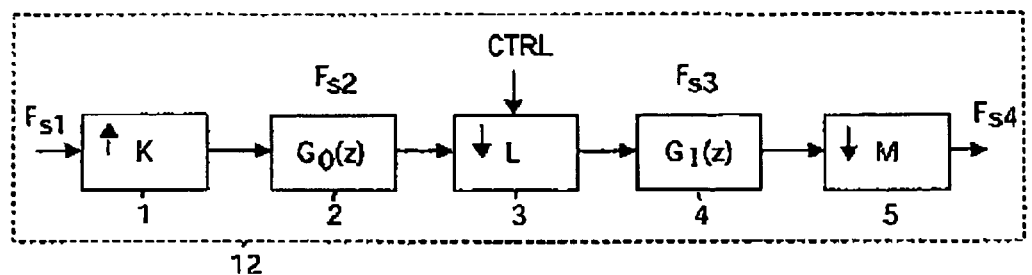

U.S. PATENT DOCUMENTS 6,650,258 B1* 11/2003 Kelly et al. .................... 341/61
6,747,581 B2* 6/2004 Hodges ....................... 341/61
6,834,292 B2* 12/2004 Jiang et al. .................. 708/313

* cited by examiner

UP AND DOWN SAMPLE RATE CONVERTER

The present application is filed under 35 U.S.C. § 371 based upon international patent application PCT/IB2004/050323, filed on Mar. 24, 2004.

The invention relates to a sample rate converter for converting an input sample rate of a signal into an output sample rate.

The invention also relates to a method for converting an input sample rate of a signal into an output sample rate, and to a computer program product for converting an input sample rate of a signal into an output sample rate, and to an apparatus comprising such a sample rate converter.

Sample rate converters are for example used in an apparatus like a player, a recorder and/or a receiver for audio and/or video like for example Compact Disk players, Digital Audio Tape players and/or recorders, TeleVision receivers, Digital Versatile Disk players and/or recorders etc., and/or are for example used in an apparatus like a video reproducer like for example monitors, displays, screens etc.

A prior art sample rate converter is known from U.S. Pat. No. 6,208,671 B1, which discloses a sample rate converter comprising an interpolation filter for upsampling with an upsampling factor U, a resampler for resampling purposes and a decimator for downsampling with a downsampling factor D. As described in column 9 of U.S. Pat. No. 6,208,671 B1, variable interpolation is used which involves varying the upsampling factor U and/or the downsampling factor D to ensure that the product of the factor D and the output sample rate is not equal to or nearly equal to the product of the factor U and the input sample rate.

The known sample rate converter is disadvantageous, inter alia, due to being complex: the resampler must calculate an estimate of the product of the factor U and the input sample rate and feed this information back to a First-In-First-Out memory in the interpolation filter for, as described in column 8 of U.S. Pat. No. 6,208,671 B1, zero-order hold the data dependently upon the factor U, for retiming the data dependently upon the factor D, and for compensating for the difference between the product of the factor U and the input sample rate and the estimate of this product as calculated by the resampler.

It is an object of the invention, inter alia, of providing a less complex sample rate converter which can be switched from an upsampling mode to a downsampling mode and vice versa.

Further objects of the invention are, inter alia, providing a less complex method and a less complex computer program product and a less complex apparatus comprising a sample rate converter, which method, computer program product and sample rate converter can be switched from an upsampling mode to a downsampling mode and vice versa.

The sample rate converter according to the invention for converting an input sample rate of a signal into an output sample rate comprises a sample rate adapter for, in response to a control signal having a first value, adapting an intermediate sample rate such that the output sample rate is larger than the input sample rate, and for, in response to a control signal having a second value, adapting the intermediate sample rate such that the output sample rate is smaller than the input sample rate.

By providing the sample rate converter with the sample rate adapter for adapting the intermediate sample rate, which intermediate sample rate can be found (is located or is situated) in the sample rate converter between the input sample rate and the output sample rate, in response to the control signal having the first value, the sample rate converter is switched into the upsampling mode (the output sample rate is larger than the input sample rate), and in response to the control signal having the second value, the sample rate converter is switched into the downsampling mode (the output sample rate is smaller than the input sample rate). Such a sample rate adapter is of a much lower complexity than the prior art resampler, and the prior art feedback loop no longer is necessary.

In a first embodiment of the sample rate converter according to the invention, the sample rate adapter comprises a variable sample rate decreaser for variably decreasing the intermediate sample rate. Herewith, the sample rate converter can be used in video applications requiring DC-out being equal to DC-in, due to this sample rate converter solving the DC problem, as further discussed below.

In a second embodiment of the sample rate converter according to invention, the sample rate converter comprises a fixed sample rate increaser for fixedly increasing the input sample rate and for generating a signal with the intermediate sample rate destined for the variable sample rate decreaser. Herewith, a filter located between the fixed sample rate increaser and the variable sample rate decreaser can be designed solely dependently upon the fixed sample rate increaser, and is independent from the variable sample rate decreaser (independent from the adaptable intermediate sample rate). Compared to U.S. Pat. No. 6,208,671 B1, in which the filter following a unit for variably upsampling the input sample rate with (a part of) the variable factor U must be adapted in dependence of (the part of) the variable factor U, the filter in the sample rate converter according to the invention between the fixed sample rate increaser and the variable sample rate decreaser can be fixed and does not need to be adapted in dependence of a variable decreasing factor. This is advantageous.

In a third embodiment of the sample rate converter according to the invention, the fixed sample rate increaser increases the input sample rate with a fixed increasing factor K, with the variable sample rate decreaser variably decreasing the intermediate sample rate with a variable decreasing factor L, with L≦K. Herewith, a filter located after the variable sample rate decreaser will be independent from the variable decreasing factor L and does not need to be adapted in dependence of this variable decreasing factor L. This is advantageous.

In a fourth embodiment of the sample rate converter according to the invention, the sample rate converter comprises a fixed sample rate decreaser for fixedly decreasing a variably decreased intermediate sample rate with a fixed factor M and for generating a signal with the output sample rate. Herewith, the filter located between the variable sample rate decreaser and the fixed sample rate decreaser can be designed solely dependently upon the fixed sample rate decreaser, and is independent from the variable sample rate decreaser. Compared to U.S. Pat. No. 6,208,671 B1, in which the filter just before a unit for variably downsampling the output sample rate with (a part of) the variable factor D must be adapted in dependence of (the part of) the variable factor D, the filter in the sample rate converter according to the invention between the variable sample rate decreaser and the fixed sample rate decreaser can be fixed and does not need to be adapted in dependence of a variable decreasing factor. This is advantageous.

In a fifth embodiment of the sample rate converter according to the invention, the sample rate adapter comprises a variable sample rate increaser for variably increasing the intermediate sample rate. Herewith, the sample rate converter can be used in audio applications not requiring DC-out being equal to DC-in, due to this sample rate converter not solving the DC problem. The variable increasing factor L introduces a variable amount of spectral images, and a DC input signal introduces a variable amount of L images, which practically cannot all be suppressed by a filter. Therefore the output signal corresponding with the DC input signal will contain disturbing components, and this problem can only be solved through measures which introduce more distorsion.

In a sixth embodiment of the sample rate converter according to the invention, the sample rate converter comprises a fixed sample rate increaser for fixedly increasing the input sample rate and for generating a signal with the intermediate sample rate destined for the variable sample rate increaser. Herewith, a filter located between the fixed sample rate increaser and the variable sample rate increaser can be designed solely dependently upon the fixed sample rate increaser, and is advantageously independent from the variable sample rate increaser.

In a seventh embodiment of the sample rate converter according to the invention, the sample rate converter comprises a fixed sample rate decreaser for fixedly decreasing a variably increased intermediate sample rate and for generating a signal with the output sample rate. Herewith, the filter located between the variable sample rate increaser and the fixed sample rate decreaser can be designed solely dependently upon the fixed sample rate decreaser, and is advantageously independent from the variable sample rate increaser.

Embodiments of the method according to the invention and of the computer program product according to the invention and of the apparatus according to the invention correspond with the embodiments of the sample rate converter according to the invention.

The invention is based upon an insight, inter alia, that prior art sample rate converters either have double (parallel) structures for upsampling and for downsampling, which double (parallel) structures require bookkeeping and introduce switching problems, or have complex structures with adaptable filters, and is based upon a basic idea, inter alia, that, in a sample rate converter having a non-double (non-parallel) or single (serial) structure, an intermediate sample rate neither being the input sample rate nor being the output sample rate is to be adapted such that overall upsampling as well as overall downsampling is possible.

The invention solves the problem, inter alia, of providing a less complex sample rate converter which can be switched from an upsampling mode to a downsampling mode and vice versa, and is advantageous, inter alia, in that this sample rate converter is of a low complexity and does not require any bookkeeping and does not introduce any switching problems.

These and other aspects of the invention will be apparent from and elucidated with reference to the embodiments(s) described hereinafter.

Figure 3:
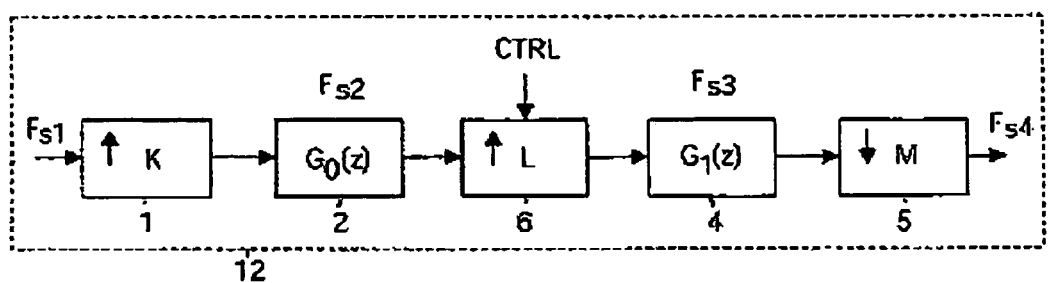
Figure 4:
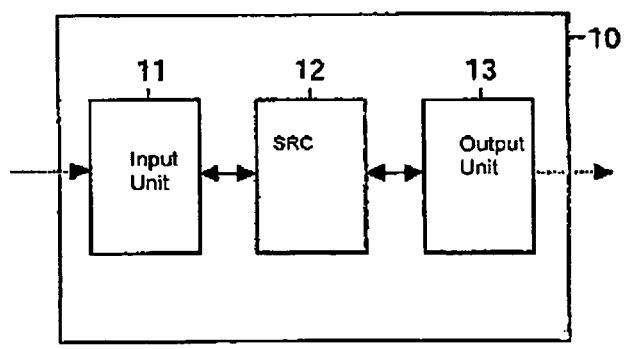
Figure 2:
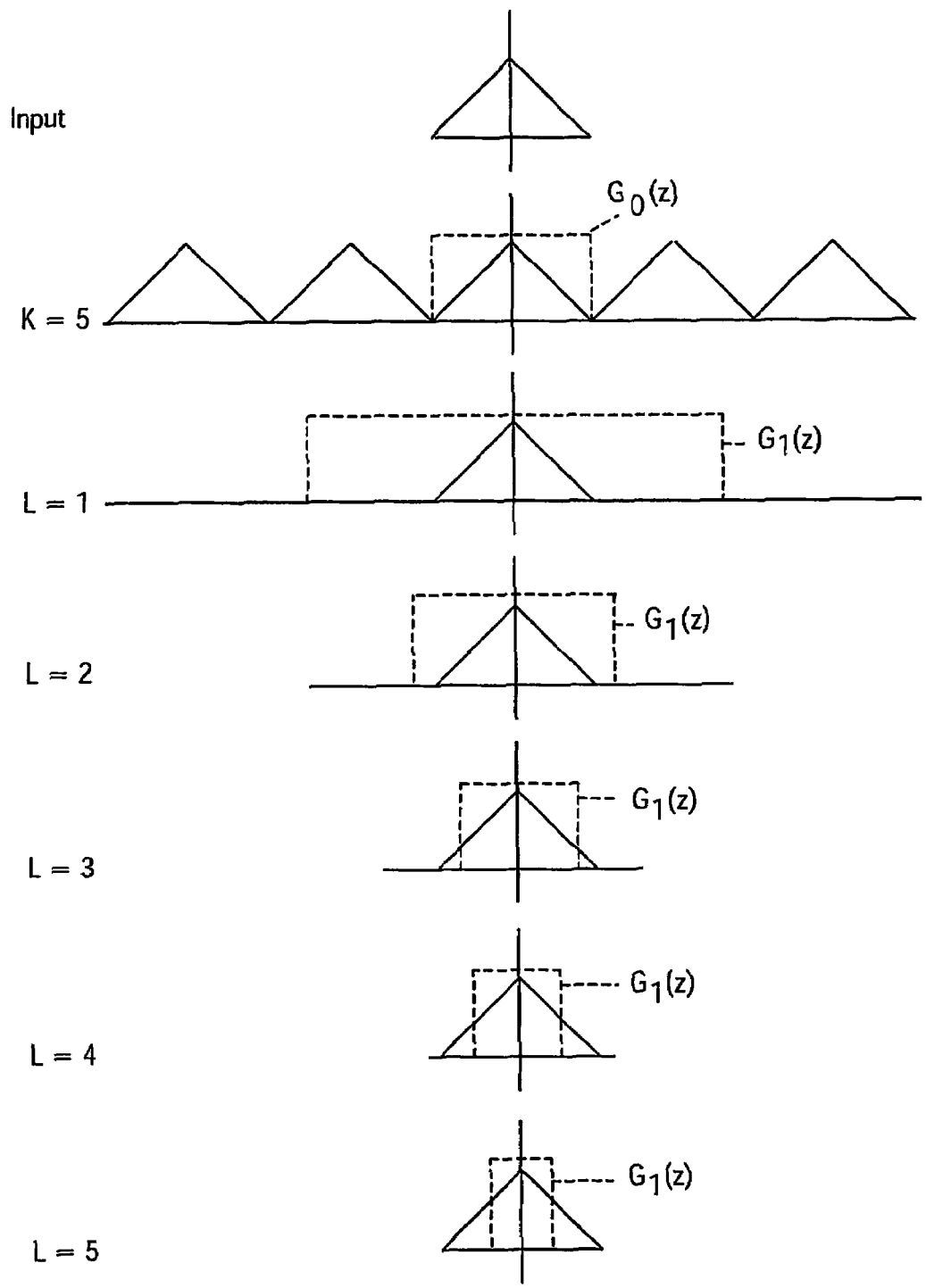

FIG. 1 illustrates in block diagram form a sample rate converter according to the invention comprising a sample rate adapter in the form of a variable sample rate decreaser, FIG. 2 illustrates some spectra for the sample rate converter shown in FIG. 1 for a fixed factor K, a fixed factor M, and five values for a variable factor L, FIG. 3 illustrates in block diagram form a sample rate converter according to the invention comprising a sample rate adapter in the form of a variable sample rate increaser, and FIG. 4 illustrates in block diagram form an apparatus according to the invention comprising a sample rate converter according to the invention.

The sample rate converter 12 according to the invention shown in FIG. 1 comprises a fixed sample rate increaser 1 for fixedly increasing an input sample rate $F_{s1}$ of an input signal and for generating a signal with/at an increased input sample rate or intermediate sample rate $F_{s2}$ to be supplied via a first filter 2 to a variable sample rate decreaser 3. A variably decreased intermediate sample rate $F_{s3}$ originating from the variable sample rate decreaser 3 is supplied via a second filter 4 to a fixed sample rate decreaser 5 for generating an output signal with/at an output sample rate $F_{s4}$.

The sample rate converter 12 converts the input sample rate $F_{s1}$ of the input signal into the output sample rate $F_{s4}$ of the output signal in a variable way, due to the sample rate adapter 3, in response to a control signal CTRL having a first value, adapting an intermediate sample rate $F_{s2}$ of the signal arriving via filter 2 such that the sample rate converter 12 performs upsampling, and, in response to a control signal CTRL having a second value, adapting the intermediate sample rate $F_{s2}$ such that the sample rate converter 12 performs downsampling.

The fixed sample rate increaser 1 increases the input sample rate $F_{s1}$ with a fixed increasing factor K, and the variable sample rate decreaser 3 variably decreases the intermediate sample rate $F_{s2}$ with a variable decreasing factor L, and fixed sample rate decreaser 5 decreases a variably decreased intermediate sample rate $F_{s3}$ with a fixed factor M. In case of $R=F_{s4}/F_{s1}$, $R=K/(M \cdot L)$. For upsampling, $R>1$ and $L<K/M$. In that case, the one or more first values are such that $L<K/M$. For downsampling, $R<1$ and $L>K/M$. In that case, the one or more second values are such that $L>K/M$. With $R_1<R<R_2$ and with $R_1<1$ and $R_2>1$, the sample rate converter 12 can switch between two non-integer values $R_1$ and $R_2$ and therefore switch between downsampling and upsampling through varying the factor L. Preferably, the relative change $\Delta L/L$ is as small as possible. When being for example smaller than 20%, the relative errors are smaller, when being for example about 50% or about 100%, the relative errors are larger.

In case of K being fixed, the first filter 2 having a filter characteristic $G_0(z)$ can be designed independently from the factor L, and in case of $L \leq K$, there will be no aliasing in the output signal of the variable sample rate decreaser 3. This first filter 2 comprises a low pass filter for suppressing K-1 images in the signal generated by sample rate increaser 1. The bandwidth of filter 2 is for example $\pi/K$, with $\pi$ corresponding with half the sampling frequency at the output of sample rate increaser 1.

FIG. 2 illustrates some spectra for the sample rate converter 12 shown in FIG. 1 for K=5, M=2, and L=1, 2, 3, 4 and 5, The input signal (input) is an arbitrary signal which may comprise energy at each frequency in its spectrum. The output signal of fixed sample rate increaser 1 (K=5) comprises the input signal and four images, with these four images being filtered by first filter 2 ($G_0(z)$). The output signals of variable sample rate decreaser 3 (L=1, L=2, L=3, L=4, L=5) are filtered by second filter 2 ($G_1(z)$) comprising a low pass filter having a bandwidth of for example $\pi/M$. For L=1 and L=2, second filter 2 can be avoided. For L=3, L=4 and L=5, second filter 2 exactly attenuates the frequency components which cause aliasing.

For a DC input signal, the fixed sample rate increaser 1 generates unwanted components at the multiples of the input sampling frequency. With first filter 1 being designed to have zeros at these frequencies, the images are suppressed well. As a result, the DC problem is solved by this sample rate converter 12, which is therefore suited to be used in video applications.

In an actual design for the sample rate converter 12 shown in FIG. 1 for scaling video sequences, K=64, M=2 and $1 \leq L \leq 64$. The sampling frequency of the input signal is $F_{s1}$, the sampling frequency at first filter 2 is $F_{s2}=64 F_{s1}$, and $G_0(z)$ has been designed to have a passband from 0 to $0.35F_{s1}$ and a transfer between ±0.5 dB, to have a stopband from $0.65F_{s1}$ to 32 $F_{s1}=F_{s2}/2$ and a stopband attenuation of −46 dB, and to have spectral zeros at multiples of $F_{s1}$ to meet the DC problem.

The sampling frequency at second filter 4 is $F_{s3}$, and $G_1(z)$ has been designed to have a passband from 0 to $0.35F_{s3}$ and a transfer between ±0.07 dB, to have a stopband from $0.65F_{s3}$ to $F_{s3}$ and a stopband attenuation of −50 dB, and to have a spectral zero at $F_{s3}$ to meet the DC problem.

The sample rate converter 12 according to the invention shown in FIG. 3 comprises the same fixed sample rate increaser 1 and the same sample rate decreaser 5 and a different variable sample rate increaser 6, and can be used in audio applications not requiring DC-out being equal to DC-in, due to this sample rate converter not solving the DC problem. The variable increasing factor L introduces a variable amount of spectral images, and a DC input signal introduces a variable amount of L images, which practically cannot all be suppressed by a filter. Therefore the output signal of this sample rate converter 12 corresponding with the DC input signal will contain disturbing components, and this problem can only be solved through measures which introduce more distorsion. However, in audio applications (K may be equal to for example $2^{15}$), this DC problem is of minor importance.

Each fixed/variable sample rate increaser/decreaser shown in FIGS. 1 and 3 may contain one or more (cascading) increasers/decreasers (if more than one then possibly separated by one or more filters). Sample Rate Increaser (SRI) 1 (or 6) for example has a sampling interval T2 at the output of the SRI 1 (or 6) equal to T1/K (or T1/L), with T1 being the sampling interval at the input. The SRI 1 (or 6) inserts (K-1) zeros (or (L-1) zeros) between every two input samples. The output signal y[nT2] is equal to x[nT1/K] (or x[nT1/L]) if n is a multiple of K (or L) and y[nT2] is equal to 0 for all other n. Sample Rate Decreaser (SRD) 3 (or 5) has a sampling interval T2 at the output of the SRD 3 (or 5) equal to LT1 (or MT1), with T1 being the sampling interval at the input. The samples x[nT1] of the SRD 3 (or 5), for which the time instant n is a multiple of the integer L (thus, if n=iL) (or of the integer M (thus, if n=iM), are transmitted to the output. All other samples are suppressed. The signal y[nT2] can be described as follows: y[nT2]=x[nLT1] (or y[nT2]=x[nMT1]. Prior art SRIs and SRDs are described in references like A. W. M. van den Enden, "Efficiency in multirate and complex digital signal processing", ISBN 90 6674 650 5, Waalre 2001 and P. P. Vaidyanathan, "Multirate systems and filter banks, Prentice-Hall, Englewood Cliffs, N.J., 1993, ISBN 0-13-605718-7.

The apparatus 10 according to the invention as shown in FIG. 4 comprises a sample rate converter 12 according to the invention located between at least one input unit 11 for receiving input information and at least one output unit 13 for generating output information. In case of apparatus 10 being a Tele Vision receiver, input unit 11 for example corresponds with a tuner and/or one or more amplifiers and/or one or more filters and/or one or more converters, with output unit 13 corresponding with a display and/or a screen including one or more drivers. In case of apparatus 10 being a Compact Disk player, input unit 11 for example corresponds with one or more optical-to-electrical converters and/or one or more amplifiers and/or one or more filters, with output unit 13 corresponding with one or more amplifiers and/or one or more filters and/or one or more converters. In case of apparatus 10 being a monitor, input unit 11 for example corresponds with one or more converters and/or one or more amplifiers and/or one or more filters, with output unit 13 corresponding with a display and/or a screen including one or more drivers. In case of apparatus 10 being a digital printer, input unit 11 for example corresponds with one or more converters and/or one or more amplifiers and/or one or more filters, with output unit 13 corresponding with one or more printing modules including one or more driven. Generally, apparatus 10 will be a data processing apparatus.

The expression "for" in "for A" and "for B" does not exclude that other functions "for C" etc. are performed as well, simultaneously or not. The expressions "X coupled to Y" and "a coupling between X and Y" and "coupling/ couples X and Y" etc. do not exclude that an element Z is in between X and Y. The expressions "P comprises Q" and "P comprising Q" etc. do not exclude that an element R is comprised/included as well.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention claimed is:

1. A sample rate converter for converting an input sample rate of a signal into an output sample rate, sample rate converter comprising a sample rate adapter operative, in response to a control signal having a first value, to adapt an intermediate sample rate such that the output sample rate is larger than the input sample rate, and, in response to a control signal having a second value, to adapt the intermediate sample rate such that the output sample rate is smaller than die input sample rate, and
   a variable sample rate decreaser operative to variably decrease the intermediate sample rate.

2. A sample rate converter according to claim 1, wherein the sample rate converter comprises a fixed sample rate increaser for fixedly increasing the input sample rate and for generating a signal with the intermediate sample rate destined for the variable sample rate decreaser.

3. A sample rate converter according to claim 2, wherein the fixed sample rate increaser increases the input sample rate with a fixed increasing factor K, with the variable sample rate decreaser variably decreasing the intermediate sample rate with a variable decreasing factor L, with $L \leq K$.

4. A sample rate converter according to claim 3, wherein the sample rate converter comprises a fixed sample rate decreaser for fixedly decreasing a variably decreased intermediate sample rate with a fixed factor M and for generating a signal with the output sample rate.

5. A sample rate converter according to claim 1, wherein the sample rate adapter comprises a variable sample rate increaser for variably increasing the intermediate sample rate.

6. A sample rate converter according to claim 5, wherein the sample rate convener comprises a fixed sample rate increaser for fixedly increasing the input sample rate and for generating a signal with the intermediate sample rate destined for the variable sample rate increaser.

7. A sample rate converter according to claim 6, wherein the sample rate converter comprises a fixed sample rate decreaser for fixedly decreasing a variably increased intermediate sample rate and for generating a signal with the output sample rate.

* * * * *